(12) United States Patent
Chang et al.

(10) Patent No.: US 11,808,959 B2
(45) Date of Patent: Nov. 7, 2023

(54) OPTICAL ELEMENT AND WAFER LEVEL OPTICAL MODULE

(71) Applicant: HIMAX TECHNOLOGIES LIMITED, Tainan (TW)

(72) Inventors: Chih-Sheng Chang, Tainan (TW); Meng-Ko Tsai, Tainan (TW); Teng Te Huang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 437 days.

(21) Appl. No.: 16/990,980

(22) Filed: Aug. 11, 2020

(65) Prior Publication Data

US 2022/0050234 A1 Feb. 17, 2022

(51) Int. Cl.
*G02B 5/20* (2006.01)
*B29D 11/00* (2006.01)

(52) U.S. Cl.
CPC .......... *G02B 5/20* (2013.01); *B29D 11/00634* (2013.01)

(58) Field of Classification Search
CPC ...... G02B 5/20; G02B 5/201; G02B 19/0028; B29D 11/00634; B29D 11/00307; H01S 5/005; H01S 5/423; H01S 5/06; H01L 27/153; H01L 33/58; H01L 2933/0058
USPC ........................................................ 359/359
See application file for complete search history.

(56) References Cited

U.S. PATENT DOCUMENTS

| | | | |
|---|---|---|---|
| 8,045,159 B2 * | 10/2011 | Egloff | G01J 3/021 356/328 |
| 9,482,796 B2 * | 11/2016 | Arbabi | G02B 5/1842 |
| 9,559,224 B2 * | 1/2017 | Rudmann | H01L 31/02325 |
| 10,734,366 B2 | 8/2020 | Rossi | |
| 2004/0023469 A1 | 2/2004 | Suda | |
| 2011/0031510 A1 * | 2/2011 | Rossi | B29D 11/00307 257/88 |

(Continued)

FOREIGN PATENT DOCUMENTS

| | | |
|---|---|---|
| CN | 103201838 | 7/2013 |
| CN | 106133919 | 7/2019 |

(Continued)

OTHER PUBLICATIONS

"Office Action of Taiwan Counterpart Application", dated Feb. 24, 2021, p. 1-p. 4.

*Primary Examiner* — Jade R Chwasz (74) *Attorney, Agent, or Firm* — JCIPRNET (57) ABSTRACT

An optical element including a first substrate, a second substrate, a first optical film, a second optical film, and a spacer is provided. The first optical film is disposed on the first substrate and has a first surface and a plurality of first optical microstructures. The first optical microstructures are disposed on the first surface. The second optical film is disposed on the second substrate and has a second surface and a plurality of second optical microstructures. The second surface is opposite to the first surface. The second optical microstructures are disposed on the second surface. The orthogonal projection of the first optical microstructures on the first substrate does not overlap with the orthogonal projection of the second optical microstructures on the first substrate. The spacer is disposed between the first substrate and the second substrate. A wafer level optical module adopting the optical element is also provided.

18 Claims, 7 Drawing Sheets

(56) References Cited

U.S. PATENT DOCUMENTS

| | | | | |
|---|---|---|---|---|
| 2012/0182714 | A1* | 7/2012 | Kwon | H05B 33/14 |
| | | | | 427/157 |
| 2014/0098433 | A1* | 4/2014 | Hsiao | G02B 13/0085 |
| | | | | 29/407.04 |
| 2015/0204511 | A1* | 7/2015 | Rudmann | G01J 3/1804 |
| | | | | 362/346 |
| 2019/0243155 | A1* | 8/2019 | You | G02B 27/4272 |

FOREIGN PATENT DOCUMENTS

| | | |
|---|---|---|
| TW | I466272 | 12/2014 |
| TW | 201807838 | 3/2018 |

* cited by examiner

OPTICAL ELEMENT AND WAFER LEVEL OPTICAL MODULE

BACKGROUND

Technical Field

The invention relates to optical element and optical module, and in particular, to an optical element and a wafer level optical module.

Description of Related Art

In recent years, along with a trend of module miniaturization and low price of electronic products, a wafer level module (WLM) technique draws attention. The WLM technique is mainly to use a wafer level fabrication technique to miniaturize a volume of the electronic product and decrease the cost thereof. For example, when the aforementioned technique is applied to fabricate wafer level optical (WLO) lens modules, the WLO lens modules may have smaller volume compares with that of a conventional lens module, so that the WLO lens modules can be applied to camera modules of, for example, mobile phones.

However, along with increasing demand on optical functionality of the electronic product, the number of optical components (for example, dot projector, flood illuminator and proximity sensor) adopted in the WLO module inevitably increases, so that the miniaturization of the WLO module becomes more difficult due to the increasing structural complexity.

SUMMARY

The disclosure provides an optical element with multi-function.

The disclosure provides a wafer level optical module with high integration and better functionality.

The optical element of the disclosure includes: a first substrate, a second substrate, a first optical film, a second optical film, and a spacer. The second substrate is disposed opposite to the first substrate. The first optical film is disposed on the first substrate and has a first surface and a plurality of first optical microstructures. The first optical microstructures are disposed on the first surface. The second optical film is disposed on the second substrate and has a second surface and a plurality of second optical microstructures. The second surface is opposite to the first surface. The second optical microstructures are disposed on the second surface. The orthogonal projection of the first optical microstructures on the first substrate does not overlap with the orthogonal projection of the second optical microstructures on the first substrate. The spacer is disposed between the first substrate and the second substrate.

In an embodiment of the disclosure, the spacer of the optical element is connected between the first optical film and the second optical film. The first surface, the second surface and the spacer define a cavity of the optical element. The first optical microstructures and the second optical microstructures are disposed in the cavity.

In an embodiment of the disclosure, the optical element further comprises an index matching layer. The index matching layer is disposed between the first substrate and the first optical film.

In an embodiment of the disclosure, the optical element further comprises a buffer layer. The buffer layer is disposed between the second substrate and the second optical film.

In an embodiment of the disclosure, according to the optical element, the orthogonal projection of the first optical film on the first substrate does not overlap with the orthogonal projection of the second optical film on the first substrate.

In an embodiment of the disclosure, according to the optical element, the first optical film overlaps the second optical film along a direction parallel to the first substrate.

In an embodiment of the disclosure, the optical element further comprises a buffer layer. The buffer layer is disposed between the second substrate and the second optical film. The orthogonal projection of the buffer layer on the second substrate does not overlap with the orthogonal projection of the first optical film on the second substrate.

In an embodiment of the disclosure, according to the optical element, the spacer is connected between the first substrate and the second substrate. The first substrate, the second substrate and the spacer define a cavity of the optical element. The first optical film and the second optical film are disposed in the cavity.

In an embodiment of the disclosure, according to the optical element, the spacer is connected between the first optical film and the second substrate. The first optical film, the second substrate and the spacer define a cavity of the optical element. The first optical microstructures and the second optical film are disposed in the cavity. The second optical film does not overlap with the first optical microstructures.

The wafer level optical module of the disclosure includes: an optical element and a light emitter. The optical element is arranged on the optical path of the light emitter. The optical element includes a first substrate, a second substrate, a first optical film, a second optical film and a spacer. The second substrate is disposed opposite to the first substrate. The first optical film is disposed on the first substrate and has a first surface and a plurality of first optical microstructures. The first optical microstructures are disposed on the first surface. The second optical film is disposed on the second substrate and has a second surface and a plurality of second optical microstructures. The second surface is opposite to the first surface. The second optical microstructures are disposed on the second surface. The orthogonal projection of the first optical microstructures on the first substrate does not overlap with the orthogonal projection of the second optical microstructures on the first substrate. The spacer is disposed between the first substrate and the second substrate. The light emitter has at least two light emitting devices. One of the at least two light emitting devices overlaps the first optical microstructures. Another one of the at least two light emitting devices overlaps the second optical microstructures.

In an embodiment of the disclosure, according to the wafer level optical module, the at least two light emitting devices are a vertical cavity surface emitting laser array.

In an embodiment of the disclosure, the light emitter of the wafer level optical module further comprises a controlling circuit board. The controlling circuit board is electrically coupled to the at least two light emitting devices. The at least two light emitting devices are independently controllable by the controlling circuit board.

In an embodiment of the disclosure, according to the wafer level optical module, the spacer is connected between the first optical film and the second optical film. The first surface, the second surface and the spacer define a cavity of the optical element. The first optical microstructures and the second optical microstructures are disposed in the cavity.

In an embodiment of the disclosure, the optical element of the wafer level optical module further comprises an index matching layer. The index matching layer is disposed between the first substrate and the first optical film.

In an embodiment of the disclosure, the optical element of the wafer level optical module further comprises a buffer layer. The buffer layer is disposed between the second substrate and the second optical film.

In an embodiment of the disclosure, according to the wafer level optical module, the orthogonal projection of the first optical film on the first substrate does not overlap with the orthogonal projection of the second optical film on the first substrate.

In an embodiment of the disclosure, according to the wafer level optical module, the first optical film overlaps the second optical film along a direction parallel to the first substrate.

In an embodiment of the disclosure, the optical element of the wafer level optical module further comprises a buffer layer. The buffer layer is disposed between the second substrate and the second optical film. The orthogonal projection of the buffer layer on the second substrate does not overlap the orthogonal projection of the first optical film on the second substrate.

In an embodiment of the disclosure, according to the wafer level optical module, the spacer is connected between the first substrate and the second substrate. The first substrate, the second substrate and the spacer define a cavity of the optical element. The first optical film and the second optical film are disposed in the cavity.

In an embodiment of the disclosure, according to the wafer level optical module, the spacer is connected between the first optical film and the second substrate. The first optical film, the second substrate and the spacer define a cavity of the optical element. The first optical microstructures and the second optical microstructures are disposed in the cavity. The second optical film does not overlap the first optical microstructures.

Based on the above, in the optical element and the wafer level optical module according to an embodiment of the disclosure, two optical films are disposed between two substrates. A gap is included between the two substrates through the arrangement of the spacer. Each of the optical films has a plurality of optical microstructures which are disposed in the gap. The plurality of optical microstructures of one of the two optical films does not overlap the plurality of optical microstructures of the other of the two optical films so that the optical element can be provided with more optical functionality. Accordingly, the integration degree of the wafer level optical module can also be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
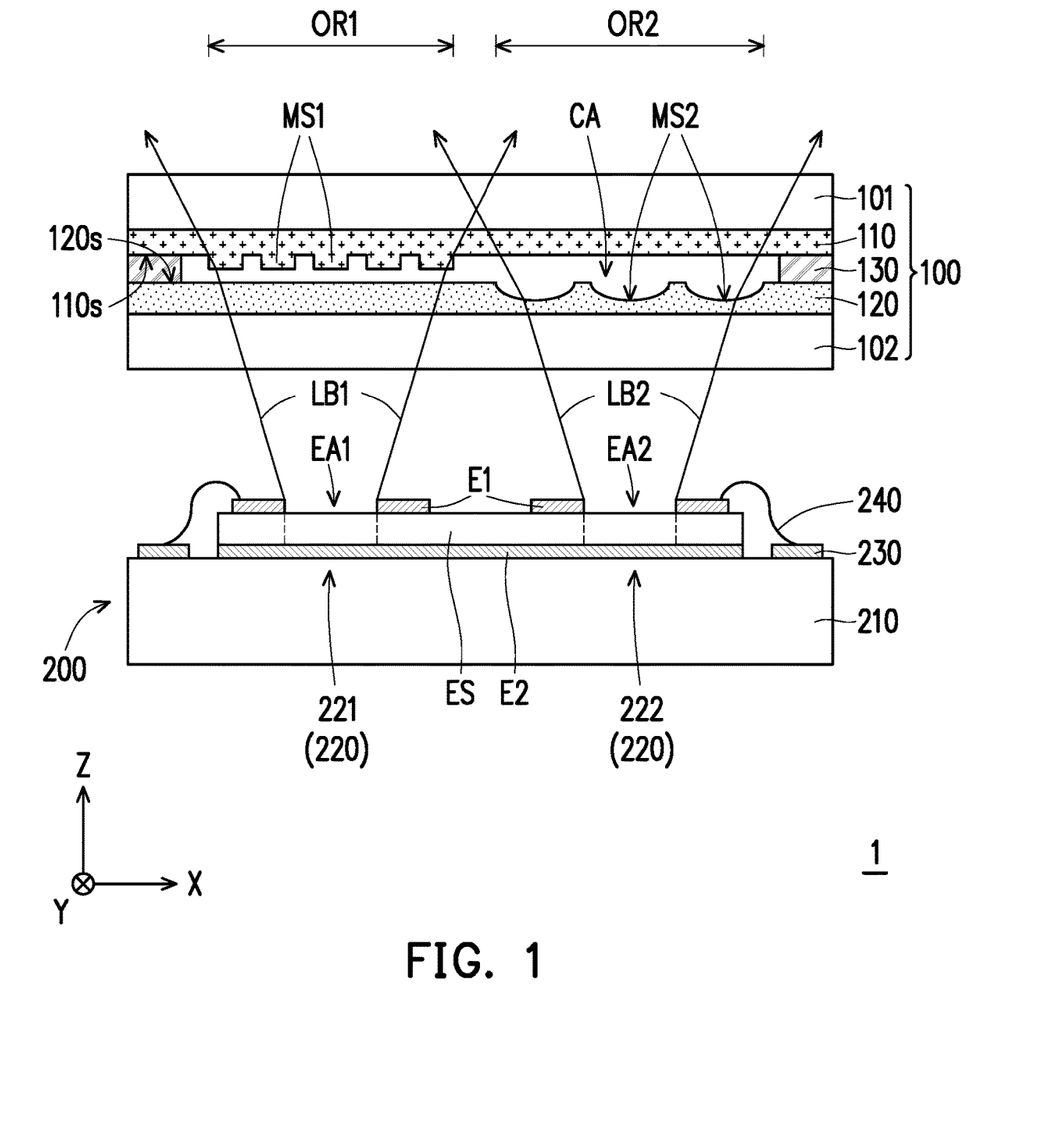
FIG. 1 is a schematic cross-sectional view of a wafer level optical module according to a first embodiment of the invention.
Figure 2:
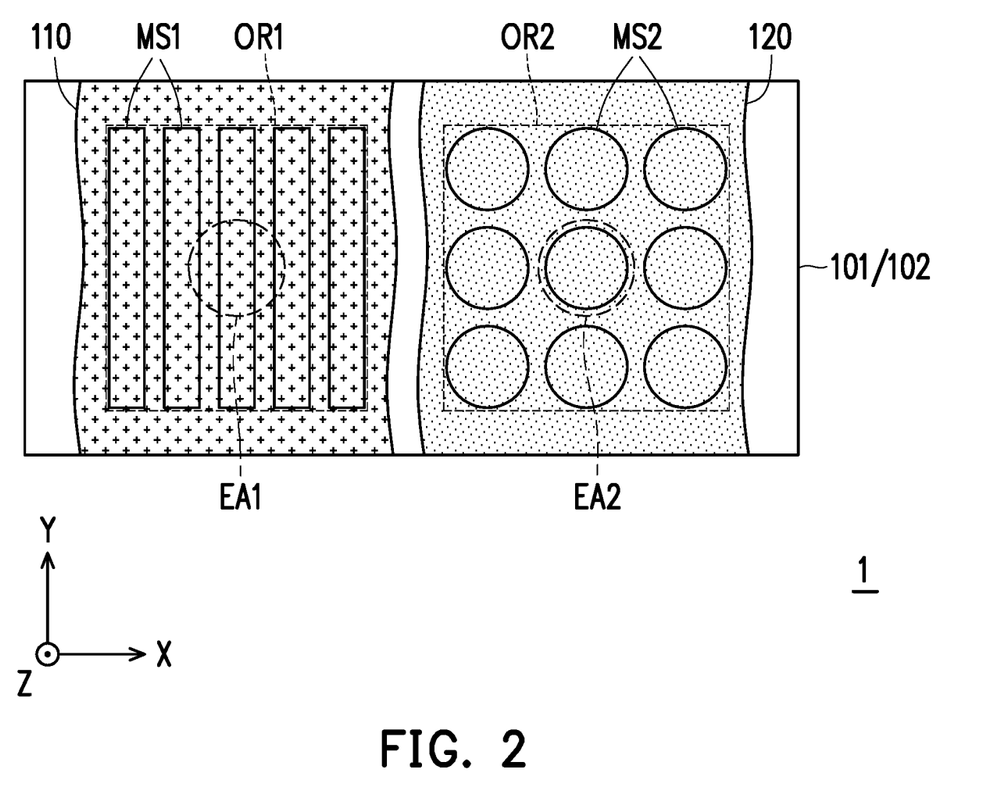
FIG. 2 is a schematic top view of the wafer level optical module in FIG. 1.

FIG. 1 is a schematic cross-sectional view of a wafer level optical module according to a first embodiment of the invention. FIG. 2 is a schematic top view of the wafer level optical module in FIG. 1. In particular, for clear presentation and explanation, FIG. 2 omits the illustration of spacer 130, first electrode E1, second electrode E2, epitaxial structure ES, circuit substrate 210, pad 230 and bonding wire 240 of FIG. 1.

Referring to FIG. 1 and FIG. 2, a wafer level optical module includes an optical element 100 and a light emitter 200. The optical element 100 is arranged on the optical path of the light emitter 200. Specifically, the light emitter 200 has a plurality of light exiting apertures, for example, a light exiting aperture EA1 and a light exiting aperture EA2. The optical element 100 is overlapped with these light exiting apertures. For example, in the present embodiment, the optical element 100 has a first optical region OR1 and a second optical region OR2. It should be noted that the first optical region OR1 and the second optical region OR2 are respectively overlapped with the light exiting aperture EA1 and the light exiting aperture EA2 of the light emitter 200.

In detail, the optical element 100 includes a first substrate 101, a second substrate 102, a first optical film 110 and a second optical film 120. The second substrate 102 is disposed opposite to the first substrate 101. The first optical film 110 and the second optical film 120 are respectively disposed on the first substrate 101 and the second substrate 102. The material of the first substrate 101 and the second substrate 102 includes glass, quartz, or polymer material (for example, polycarbonate, or acrylic), but the invention is not limited thereto. The material of the first optical film 110 and the second optical film 120 includes a photocurable material (ultraviolet curable resin, for example), heat-curing material, or a combination thereof, but the invention is not limited thereto.

Further, the first optical film 110 has a first surface 110s and a plurality of first optical microstructures MS1. The first optical microstructures MS1 are disposed on the first surface 110s. The second optical film 120 has a second surface 120s and a plurality of second optical microstructures MS2. The second surface 120s of the second optical film 120 is opposite to the first surface 110s of the first optical film 110. The second optical microstructures MS2 are disposed on the second surface. In the present embodiment, the first optical region OR1 of the optical element 100 is defined by the first optical microstructures MS1, and the second optical region OR2 of the optical element 100 is defined by the second optical microstructures MS2.

For example, the first optical microstructures MS1 of the present embodiment are stripe patterns protruded from the first surface 110s. Theses stripe patterns are arranged along a direction X and extend in a direction Y. The direction X intersects the direction Y. However, the invention is not limited thereto. According to other embodiment, the first optical microstructures MS1 may be concentric-circle pattern. In the present embodiment, a width of the stripe pattern or a pitch between adjacent stripe patterns in the direction X may be ranged from 0.2 micron to 200 microns, but the invention is not limited thereto.

On the other hand, the second optical microstructures MS2 are concave lens structures recessed from the second surface 120s. The outline of orthogonal projection of these concave lens structures on the second surface 120s is circular. The second optical microstructures MS2 are arranged in multiple rows and multiple columns along the direction X and the direction Y. Namely, the second optical microstructures MS2 are arranged in an array on the second surface 120s, but the invention is not limited thereto. According to other embodiment, the second optical microstructures MS2 may also be in a honeycomb-like arrangement. In the present embodiment, a width of the concave lens structure or a pitch between adjacent concave lens structures may be ranged from 15 microns to 55 microns, but the invention is not limited thereto.

In the present embodiment, the formation of the first optical microstructures MS1 of the first optical film 110 may be carried out through a molding process on a heat-curing glue layer, and the formation of the second optical microstructures MS2 of the second optical film 120 may be carried out through an imprinting process on a photocurable glue layer. The coating process of the heat-curing glue layer and photocurable glue layer may include spraying process, spin-coating process, or dispensing process. However, the invention is not limited thereto. In other embodiments, the material of the first optical film 110 and the material of the second optical film 120 may be adjusted to be the same according to the actual optical design requirement of the optical element. It should be understood that the formation method of the first optical film 110 and the second optical film 120 can be adjusted as well according to the material selection of the optical film and the actual design condition of optical microstructures.

It should be noted that the number of the first optical microstructures MS1 and the number of the second optical microstructures MS2 illustrated in FIG. 2 are exemplarily described by taking five and nine as example, and does not mean that the invention is limited thereto. In other embodiments, the number of the first optical microstructures MS1 and the number of the second optical microstructures MS2 may also be adjusted according to the actual design requirement of the optical element.

The light emitter 200 includes a controlling circuit board 210 and at least two light emitting devices 220 (for example, a light emitting device 221 and a light emitting device 222). The at least two light emitting devices 220 are disposed on the controlling circuit board 210 and electrically coupled to the controlling circuit board 210. More specifically, the controlling circuit board 210 has a plurality of pads 230, and the at least two light emitting devices 220 are electrically connected to the pads 230 through a plurality of bonding wires 240. It should be noted that the at least two light emitting devices 220 are independently controllable by the controlling circuit board 210.

Each of the light emitting devices 220 has a first electrode E1, a second electrode E2 and an epitaxial structure ES. The first electrode E1 and the second electrode E2 are disposed on two opposite sides of the epitaxial structure ES. In the present embodiment, the first electrode E1 may be a ring-like structure, and the light exiting aperture can be defined by the first electrode E1. For example, the light exiting aperture EA1 and the light exiting aperture EA2 are respectively defined by the first electrodes E1 of the light emitting device 221 and the light emitting device 222. The light emitting device 221 and the light emitting device 222 can be independently controlled by the controlling circuit board 210 to emit a light beam LB1 and a light beam LB2, respectively.

The light beam LB1 emitted from the light exiting aperture EA1 is transmitted to the first optical microstructures MS1. The light beam LB2 emitted from the light exiting aperture EA2 is transmitted to the second optical microstructures MS2. From another point of view, the first optical region OR1 (or the first optical microstructures MS1) of the optical element 100 cannot be irradiated by the light beam LB1 emitting from the light exiting aperture EA1, and the second optical region OR2 (or the second optical microstructures MS2) of the optical element 100 cannot be irradiated by the light beam LB2 emitting from the light exiting aperture EA2.

It is worth noting that the first optical microstructures MS1 of the first optical film 110 do not overlap with the second optical microstructures MS2 of the second optical film 120 along the normal direction (for example, a direction Z) of the first surface 110s, so that the optical element 100 can be provided with more optical functionality. Accordingly, the integration degree of the wafer level optical module 1 can also be improved. For example, the optical function of the first optical microstructures MS1 may be similar to that of a diffractive optic element (DOE), and a combination of the light emitting device 221 and the first optical microstructures MS1 may be a flood illuminator. On the other hand, the optical function of the second optical microstructures MS2 may be similar to that of a fly-eye lens, and a combination of the light emitting device 222 and the second optical microstructures MS2 may be a dot projector. That means, the wafer level optical module of the present embodiment could be a 3D sensor module, but the invention is not limited thereto.

In the present embodiment, the light emitting device 220 may be a vertical cavity surface emitting laser (VCSEL). Namely, the at least two light emitting devices 220 may form a VCSEL array. However, the invention is not limited thereto. According to other embodiments, the light emitting device 220 may also be a micro light emitting diode (micro-LED) or a mini light emitting diode (mini-LED). In the present embodiment, the epitaxial structures ES of the light emitting devices 200 are connected to each other. That means, the epitaxial structures ES of the light emitting device 221 and the light emitting device 222 can be formed on the same epitaxial substrate (for example, a GaAs substrate or a Sapphire substrate), but the invention is not limited thereto.

Furthermore, the optical element 100 further includes a spacer 130. The spacer 130 is disposed between the first substrate 101 and the second substrate 102. In the present embodiment, the spacer 130 is connected between the first optical film 110 and the second optical film 120. The first surface 110s of the first optical film 110, the second surface 120s of the second optical film 120 and the spacer 130 define a cavity CA of the optical element 100. That is, a gap between the first optical film 110 and the second optical film 120 can be controlled by the spacer 130. It is worth noting that the first optical microstructures MS1 of the first optical film 110 and the second optical microstructures MS2 of the second optical film 120 are disposed in the cavity CA, so that the optical microstructures of the optical film can be prevented from being damaged during a manufacturing process of the wafer level optical module 1. That is, the production yield of the optical element 100 (or wafer level optical module 1) can be improved. For example, the spacer 130 may be an adhesive tape, but the invention is not limited thereto.

In the following, other embodiments are provided to explain the disclosure in detail, wherein same components will be denoted by the same reference numerals, and the description of the same technical content will be omitted. For the omitted part, please refer to the foregoing embodiment, and the details are not described below. The descriptions regarding the omitted part may be referred to the previous embodiment, and thus will not be repeated herein.

Figure 3:
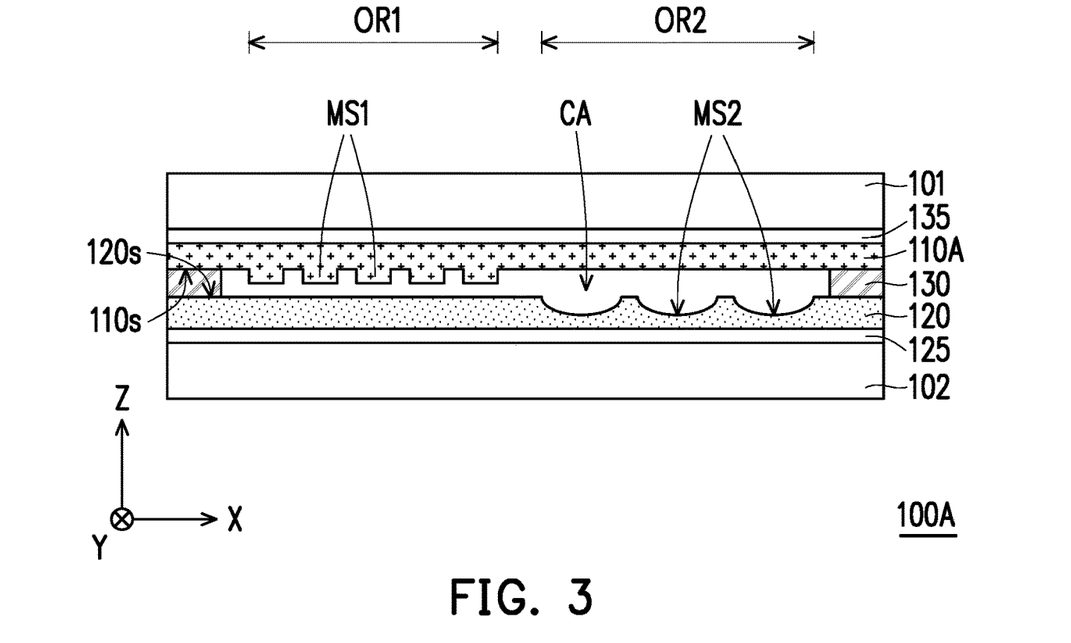
FIG. 3 is a schematic cross-sectional view of an optical element according to a second embodiment of the invention.

FIG. 3 is a schematic cross-sectional view of an optical element according to a second embodiment of the invention.

Referring to FIG. 3, the difference between the optical element 100A of the present embodiment and the optical element 100 of FIG. 1 lies in the composition of the optical element. In the present embodiment, the optical element 100A further includes an index matching layer 135 and a buffer layer 125. The index matching layer 135 is disposed between the first substrate 101 and the first optical film 110A. The buffer layer 125 is disposed between the second substrate 102 and the second optical film 120. Due to the refractive index of the first optical film 110A is high (for example, the refractive index is greater than 1.7), the reflection of the light beam at the interface between the first substrate 101 and the first optical film 110A can be inhibited by configuring the index matching layer 135. In the present embodiment, the width of the first optical microstructure MS1 or the pitch between adjacent first optical microstructures MS1 in the direction X may be less than 1.5 microns.

On the other hand, by configuring the buffer layer 125, the reliability of the optical element 100A under thermal cycle test can be improved. That is, the resistance of the optical element 100A to repeated heat/cold shocks can be increased. However, the invention is not limited thereto. In other embodiments, the optical element may merely have one of the index matching layer 135 and the buffer layer 125.

Figure 4:
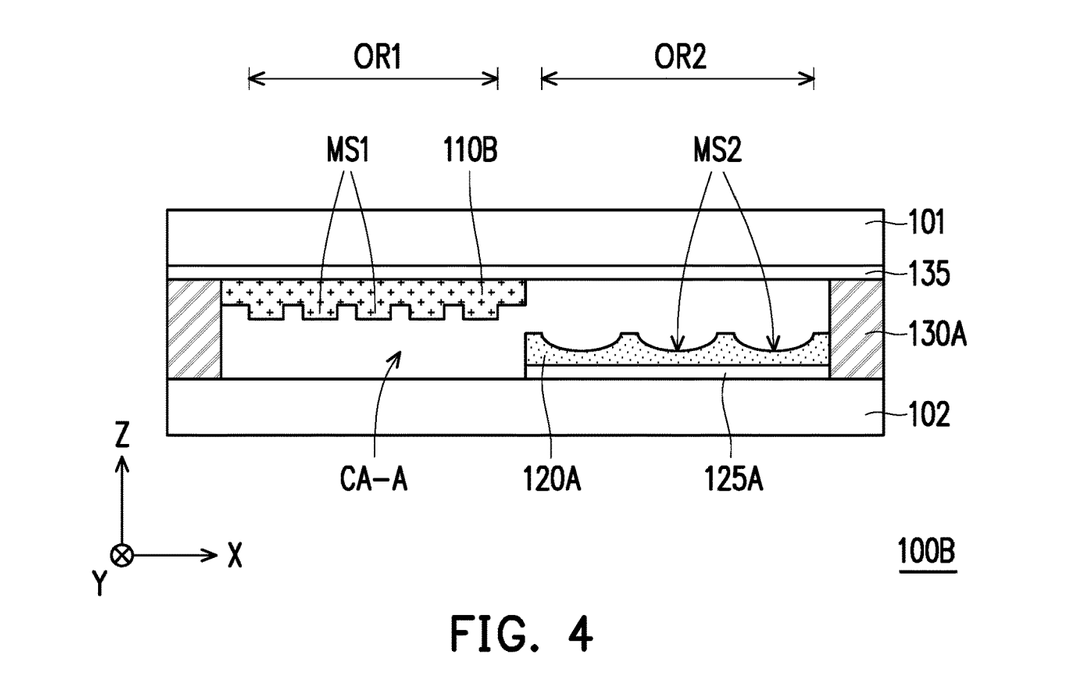
FIG. 4 is a schematic cross-sectional view of an optical element according to a third embodiment of the invention.

FIG. 4 is a schematic cross-sectional view of an optical element according to a third embodiment of the invention.

Referring to FIG. 4, the difference between the optical element 100B of the present embodiment and the optical element 100A of FIG. 3 lies in the configuration of the optical element. In the present embodiment, the spacer 130A is connected between the index matching layer 135 and the second substrate 102. The index matching layer 135, the second substrate 102 and the spacer 130A define a cavity CA-A of the optical element 100B. The first optical film 110B, the second optical film 120A and the buffer layer 125A are disposed in the cavity CA-A.

Particularly, the orthogonal projection of the first optical film 110B on the first substrate 101 does not overlap with the orthogonal projection of the second optical film 120A on the first substrate 101. For example, compared to the optical element 100A of FIG. 3, the manufacturing process of the optical element 100B may further include a laser cutting step. In the present embodiment, two laser cutting processes have to be carried out for both the optical films before the assembly of the optical element 100B. For example, the first optical film 110B is obtained by adopting one laser cutting process to remove a portion overlapping the second optical region OR2 (as shown in FIG. 3), and the second optical film 120A is obtained by adopting another laser cutting process to remove a portion overlapping the first optical region OR1 (as shown in FIG. 3), but the invention is not limited thereto.

Further, in the laser cutting process of the first optical film 110B, the index matching layer 135 still remains the part overlapping the second optical region OR2. Contrarily, in the laser cutting process of the second optical film 120A, the buffer layer 125A is simultaneously removed as well. Namely, the remaining part of the buffer layer 125A does not overlap the first optical film 110B. However, the invention in not limited thereto. In other embodiments, a portion of the index matching layer overlapping the second optical region OR2 may also be simultaneously removed in the laser cutting process of the first optical film 110B.

Figure 5:
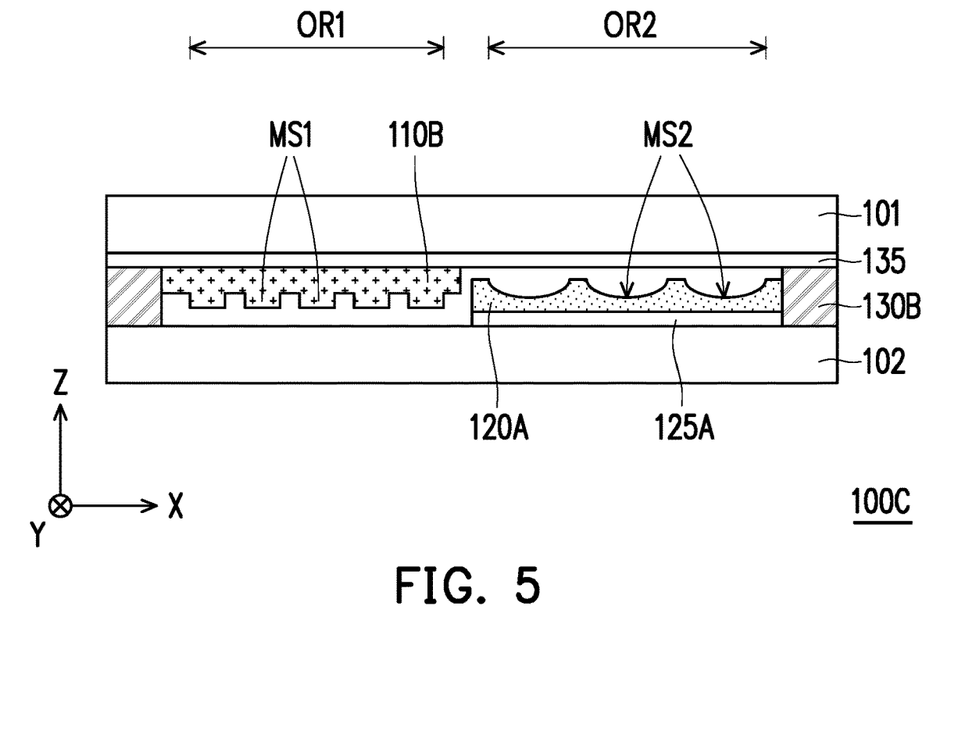
FIG. 5 is a schematic cross-sectional view of an optical element according to a fourth embodiment of the invention.

FIG. 5 is a schematic cross-sectional view of an optical element according to a fourth embodiment of the invention.

Referring to FIG. 5, the difference between the optical element 100C of the present embodiment and the optical element 100B of FIG. 4 lies in the configuration of the optical element. Specifically, the spacer 130B of the optical element 100C has a smaller thickness compared to that of the spacer 130A of FIG. 4, so that the first optical film 110B overlaps the second optical film 120A along a direction (for example, the direction X) parallel to the first substrate 101. Accordingly, the whole thickness of the optical element 100C can be further reduced.

Figure 6:
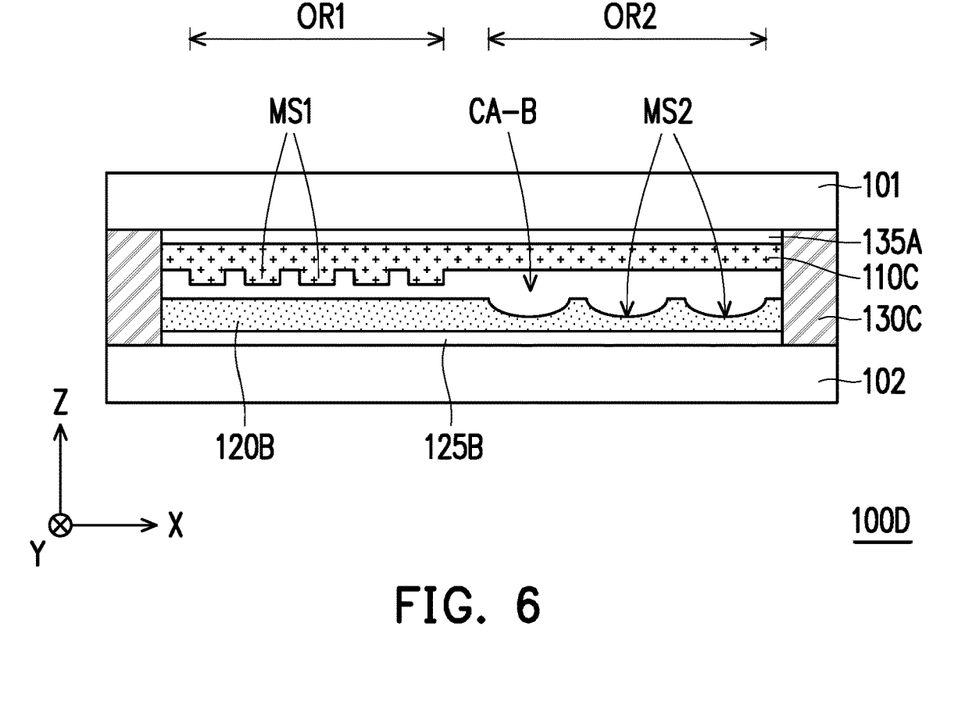
FIG. 6 is a schematic cross-sectional view of an optical element according to a fifth embodiment of the invention.

FIG. 6 is a schematic cross-sectional view of an optical element according to a fifth embodiment of the invention.

Referring to FIG. 6, the difference between the optical element 100D of the present embodiment and the optical element 100A of FIG. 3 lies in the configuration of the optical element. In the present embodiment, the spacer 130C is directly connected between the first substrate 101 and the second substrate 102. The first substrate 101, the second substrate 102 and the spacer 130C define a cavity CA-B of the optical element 100D. The first optical film 110C, the second optical film 120B, the buffer layer 125B and the index matching layer 135A are disposed in the cavity CA-B. For example, the first optical film 110C may be obtained by adopting one laser cutting process to remove a portion overlapping a predetermined region for the spacer 130C, and the second optical film 120A may be obtained by adopting another laser cutting process to remove a portion overlapping the predetermined region for the spacer 130C, but the invention is not limited thereto.

Figure 7:
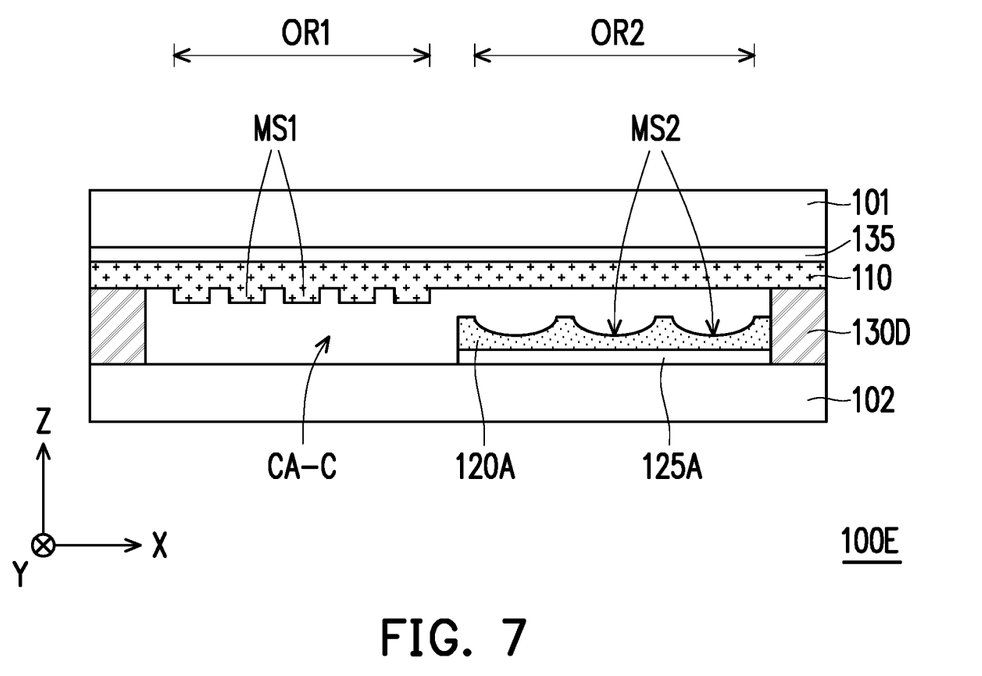
FIG. 7 is a schematic cross-sectional view of an optical element according to a sixth embodiment of the invention.

FIG. 7 is a schematic cross-sectional view of an optical element according to a sixth embodiment of the invention.

Referring to FIG. 7, the difference between the optical element 100E of the present embodiment and the optical element 100B of FIG. 4 lies in the configuration of the optical film. In the present embodiment, the spacer 130D is connected between the first optical film 110 and the second substrate 102. The first optical film 110, the second substrate 102 and the spacer 130D define a cavity CA-C of optical element 100E. The plurality of first optical microstructures MS1, the second optical film 120A and the buffer layer 125A are disposed in the cavity CA-C.

Specifically, the manufacturing process of the optical element 100E may merely include a laser cutting process. In the present embodiment, for example, the second optical film 120A is obtained by adopting the laser cutting process to remove the parts of second optical film (as shown in FIG. 1) overlapping the first optical region OR1 and a predetermined region for the spacer 130D, but the invention is not limited thereto. According to other embodiments, the only one laser cutting process may also be carried out to remove the parts of the first optical film 110 overlapping the second optical region OR2 and the predetermined region for the spacer 130D.

Figure 8:
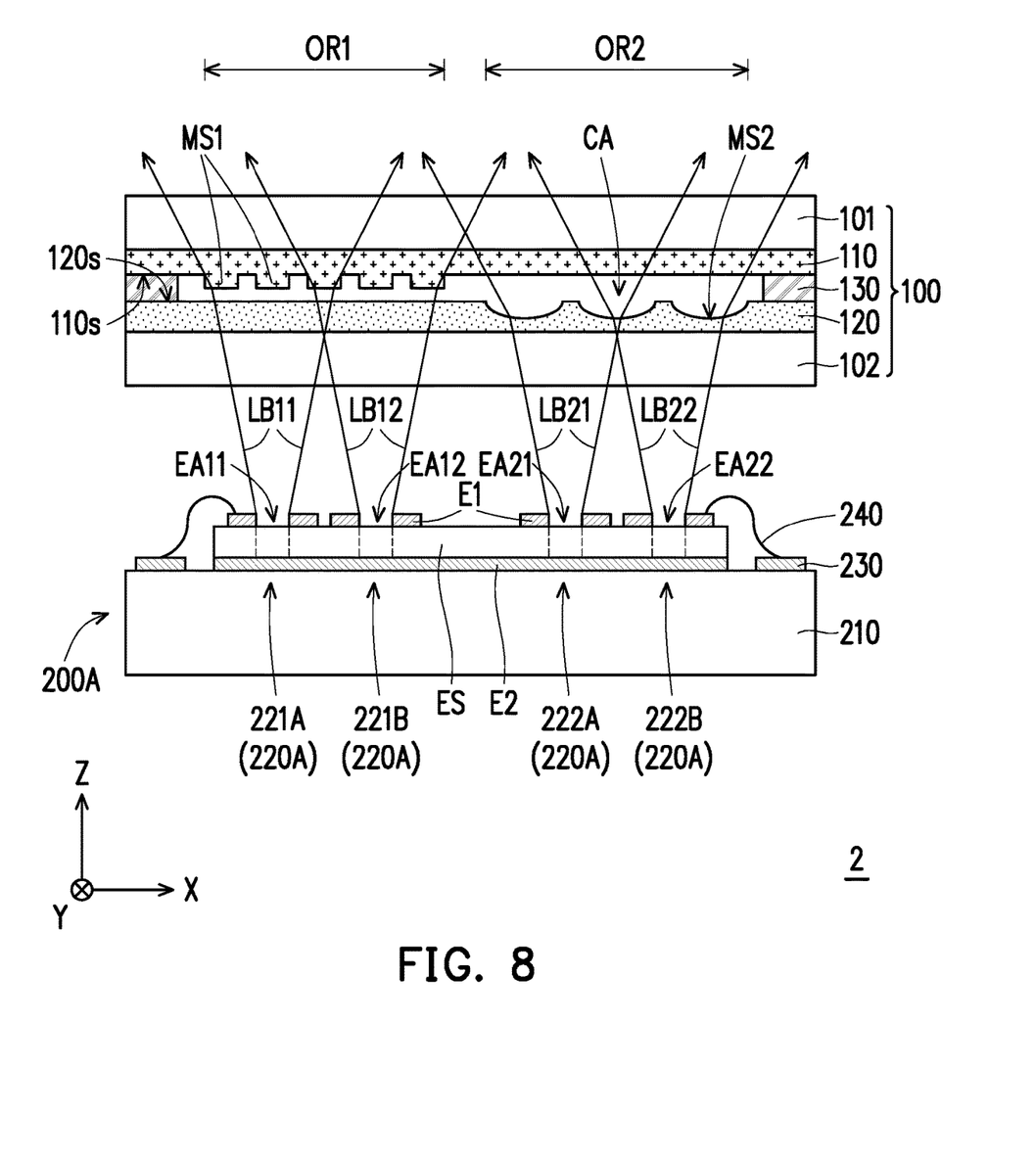
FIG. 8 is a schematic cross-sectional view of a wafer level optical module according to another embodiment of the invention.
Figure 9:
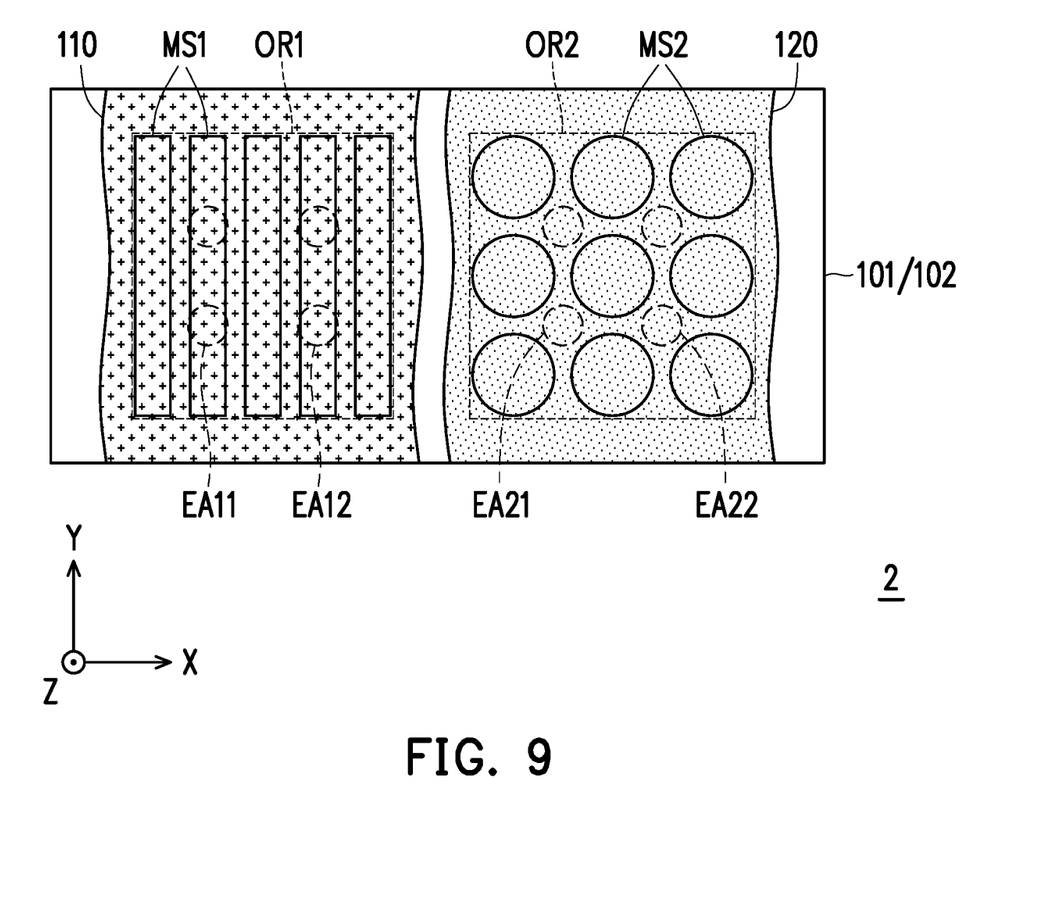
FIG. 9 is a schematic top view of the wafer level optical module in FIG. 8.

FIG. 8 is a schematic cross-sectional view of a wafer level optical module according to another embodiment of the invention. FIG. 9 is a schematic top view of the wafer level optical module in FIG. 8. In particular, for clear presentation and explanation, FIG. 9 omits the illustration of spacer 130, first electrode E1, second electrode E2, epitaxial structure ES, circuit substrate 210, pad 230 and bonding wire 240 of FIG. 8.

Referring to FIG. 8 and FIG. 9, the difference between the wafer level optical module 2 of the present embodiment and the wafer level optical module 1 lies in the configuration of the light emitter. For example, the number of the light emitting device 220A overlapping each optical region is greater than that of the light emitting device 220 of FIG. 1. In the present embodiment, the light emitter 200A includes eight light emitting devices 220A. Part of the light emitting devices 220A (for example, the light emitting device 221A and the light emitting device 221B) overlap the first optical region OR1 and the rest part of the light emitting devices 220A (for example, the light emitting device 222A and the light emitting device 222B) overlap the second optical region OR2. From another point of view, each of the optical region OR1 and the optical region OR2 are overlapped with four light exiting aperture of the light emitter 200A.

It should be noted that the light emitter 200A is similar to the light emitter 200 of FIG. 1. Therefore, for detail description, please refer to the relevant paragraphs of the foregoing embodiment, and will not be repeated here. In the present embodiment, for example, the light exiting aperture EA11, the light exiting aperture EA12, the light exiting aperture EA21 and the light exiting aperture EA22 are respectively defined by the first electrodes E1 of the light emitting device 221A, the light emitting device 221B, the light emitting device 222A and the light emitting device 222B. The light emitting devices 220A can be independently controlled by the controlling circuit board 210 to emit light beams, respectively.

For example, the light beam LB11 emitted from the light exiting aperture EA11 and the light beam LB12 emitted from the light exiting aperture EA12 are transmitted to different parts of the first optical microstructures MS1. Similarly, the light beam LB21 emitted from the light exiting aperture EA21 and the light beam LB22 emitted from the light exiting aperture EA22 are transmitted to different parts of the second optical microstructures MS2. More specifically, each of the first optical region OR1 and the second optical region OR2 of the optical element 100 can be locally irradiated by at least one selected light emitting device 220A. The wafer level optical module 2 may enable at least one light emitting device 220A for power saving according to the position of an object or a projection surface. From another point of view, the operational flexibility of the wafer level optical module 2 can also be improved.

In summary, in the optical element and the wafer level optical module according to an embodiment of the disclosure, two optical films are disposed between two substrates. A gap is included between the two substrates through the arrangement of the spacer. Each of the optical films has a plurality of optical microstructures which are disposed in the gap. The plurality of optical microstructures of one of the two optical films does not overlap the plurality of optical microstructures of the other of the two optical films so that the optical element can be provided with more optical functionality. Accordingly, the integration degree of the wafer level optical module can also be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An optical element, comprising:
   a first substrate;
   a second substrate, disposed opposite to the first substrate;
   a first optical film, disposed on the first substrate, the first optical film has a first surface and a plurality of first optical microstructures, the first optical microstructures are disposed on the first surface;
   a second optical film, disposed on the second substrate, wherein the second optical film has a second surface and a plurality of second optical microstructures, the second surface is opposite to the first surface, the second optical microstructures are disposed on the second surface, and the orthogonal projection of the first optical microstructures on the first substrate does not overlap with the orthogonal projection of the second optical microstructures on the first substrate; and
   a spacer, disposed between the first substrate and the second substrate, wherein the spacer directly contacts the first optical film and the second optical film, the first surface, the second surface and the spacer define a cavity of the optical element, and the first optical microstructures and the second optical microstructures are disposed in the cavity.

2. The optical element as claimed in claim 1, further comprising:
an index matching layer, disposed between the first substrate and the first optical film.

3. The optical element as claimed in claim 2, further comprising:
a buffer layer, disposed between the second substrate and the second optical film.

4. The optical element as claimed in claim 1, wherein the orthogonal projection of the first optical film on the first substrate does not overlap with the orthogonal projection of the second optical film on the first substrate.

5. The optical element as claimed in claim 4, wherein the first optical film overlaps the second optical film along a direction parallel to the first substrate.

6. The optical element as claimed in claim 4, further comprising:
a buffer layer, disposed between the second substrate and the second optical film, and the orthogonal projection of the buffer layer on the second substrate does not overlap with the orthogonal projection of the first optical film on the second substrate.

7. The optical element as claimed in claim 1, wherein the spacer is connected between the first substrate and the second substrate, the first substrate, the second substrate and the spacer define a cavity of the optical element, and the first optical film and the second optical film are disposed in the cavity.

8. The optical element as claimed in claim 1, wherein the spacer is connected between the first optical film and the second substrate, the first optical film, the second substrate and the spacer define a cavity of the optical element, the first optical microstructures and the second optical film are disposed in the cavity, and the second optical film does not overlap with the first optical microstructures.

9. A wafer level optical module, comprising:
an optical element, comprising:
a first substrate;
a second substrate, disposed opposite to the first substrate;
a first optical film, disposed on the first substrate, the first optical film has a first surface and a plurality of first optical microstructures, the first optical microstructures are disposed on the first surface;
a second optical film, disposed on the second substrate, wherein the second optical film has a second surface and a plurality of second optical microstructures, the second surface is opposite to the first surface, the second optical microstructures are disposed on the second surface, and the orthogonal projection of the first optical microstructures on the first substrate does not overlap with the orthogonal projection of the second optical microstructures on the first substrate; and
a spacer, disposed between the first substrate and the second substrate; and
a light emitter, having at least two light emitting devices, wherein the optical element is arranged on the optical path of the light emitter, one of the at least two light emitting devices overlaps the first optical microstructures, and another one of the at least two light emitting devices overlaps the second optical microstructures, wherein the spacer directly contacts the first optical film and the second optical film, the first surface, the second surface and the spacer define a cavity of the optical element, and the first optical microstructures and the second optical microstructures are disposed in the cavity.

10. The wafer level optical module as claimed in claim 9, wherein the at least two light emitting devices are a vertical cavity surface emitting laser array.

11. The wafer level optical module as claimed in claim 9, wherein the light emitter further comprising:
a controlling circuit board, electrically coupled to the at least two light emitting devices, wherein the at least two light emitting devices are independently controllable by the controlling circuit board.

12. The wafer level optical module as claimed in claim 9, wherein the optical element further comprises:
an index matching layer, disposed between the first substrate and the first optical film.

13. The wafer level optical module as claimed in claim 12, wherein the optical element further comprises:
a buffer layer, disposed between the second substrate and the second optical film.

14. The wafer level optical module as claimed in claim 9, wherein the orthogonal projection of the first optical film on the first substrate does not overlap with the orthogonal projection of the second optical film on the first substrate.

15. The wafer level optical module as claimed in claim 14, wherein the first optical film overlaps the second optical film along a direction parallel to the first substrate.

16. The wafer level optical module as claimed in claim 14, wherein the optical element further comprises:
a buffer layer, disposed between the second substrate and the second optical film, the orthogonal projection of the buffer layer on the second substrate does not overlap the orthogonal projection of the first optical film on the second substrate.

17. The wafer level optical module as claimed in claim 9, wherein the spacer is connected between the first substrate and the second substrate, the first substrate, the second substrate and the spacer define a cavity of the optical element, and the first optical film and the second optical film are disposed in the cavity.

18. The wafer level optical module as claimed in claim 9, wherein the spacer is connected between the first optical film and the second substrate, the first optical film, the second substrate and the spacer define a cavity of the optical element, the first optical microstructures and the second optical microstructures are disposed in the cavity, and the second optical film does not overlap the first optical microstructures.

* * * * *